United States Patent
Watanabe et al.

(10) Patent No.: US 9,926,646 B2
(45) Date of Patent: Mar. 27, 2018

(54) METHOD FOR GROWING B-GA2O3-BASED SINGLE CRYSTAL

(71) Applicants: TAMURA CORPORATION, Tokyo (JP); KOHA CO., LTD., Tokyo (JP)

(72) Inventors: Shinya Watanabe, Tokyo (JP); Daiki Wakimoto, Tokyo (JP); Kazuyuki Iizuka, Tokyo (JP); Kimiyoshi Koshi, Tokyo (JP); Takekazu Masui, Tokyo (JP)

(73) Assignees: TAMURA CORPORATION, Tokyo (JP); KOHA CO., LTD., Tokyo (JP)

( * ) Notice: Subject to any disclaimer, the term of this patent is extended or adjusted under 35 U.S.C. 154(b) by 0 days.

(21) Appl. No.: 14/441,376

(22) PCT Filed: Oct. 9, 2013

(86) PCT No.: PCT/JP2013/077489
§ 371 (c)(1),
(2) Date: May 7, 2015

(87) PCT Pub. No.: WO2014/073314
PCT Pub. Date: May 15, 2014

(65) Prior Publication Data
US 2015/0308012 A1    Oct. 29, 2015

(30) Foreign Application Priority Data
Nov. 7, 2012  (JP) .................................. 2012-245357

(51) Int. Cl.
*C30B 15/36* (2006.01)
*C30B 15/34* (2006.01)
(Continued)

(52) U.S. Cl.
CPC .............. *C30B 15/34* (2013.01); *C30B 15/30* (2013.01); *C30B 15/36* (2013.01); *C30B 29/16* (2013.01)

(58) Field of Classification Search
CPC .......... C30B 29/16; C30B 15/34; C30B 15/36
See application file for complete search history.

(56) References Cited

U.S. PATENT DOCUMENTS

| 6,506,251 B1 | 1/2003 | Kitagawa et al. |
| 2004/0007708 A1* | 1/2004 | Ichinose ................. C30B 15/00 257/79 |

(Continued)

FOREIGN PATENT DOCUMENTS

| CN | 1474466 A | 2/2004 |
| EP | 1 367 657 A2 | 12/2003 |

(Continued)

OTHER PUBLICATIONS

International Search Report (ISR) (PCT Form PCT/ISA/210), in PCT/JP2013/077489, dated Jan. 14, 2014.
(Continued)

*Primary Examiner* — Matthew Song
(74) *Attorney, Agent, or Firm* — McGinn IP Law Group, PLLC

(57) ABSTRACT

A method for growing a β-Ga$_2$O$_3$-based single crystal, can provide a plate-shaped β-Ga$_2$O$_3$-based single crystal having high crystal quality. In one embodiment, a method for growing a β-Ga$_2$O$_3$-based single crystal employing an EFG method is provided, the method including: bringing a plate-shaped seed crystal into contact with a Ga$_2$O$_3$-based melt, wherein the plate-shaped seed crystal includes a β-Ga$_2$O$_3$-based single crystal having a defect density of not more than $5 \times 10^5$ /cm$^2$ in the whole region; and pulling up the seed crystal to grow a β-Ga$_2$O$_3$-based single crystal.

9 Claims, 4 Drawing Sheets

(51) Int. Cl.
*C30B 29/16* (2006.01)
*C30B 15/30* (2006.01)

(56) References Cited

U.S. PATENT DOCUMENTS

| | | |
|---|---|---|
| 2006/0001031 A1 | 1/2006 | Ichinose et al. |
| 2006/0150891 A1* | 7/2006 | Ichinose ................. C30B 23/02 117/2 |
| 2008/0070337 A1 | 3/2008 | Ichinose et al. |
| 2008/0237607 A1 | 10/2008 | Ichinose et al. |
| 2010/0038652 A1 | 2/2010 | Ichinose et al. |
| 2011/0220011 A1* | 9/2011 | Miyanaga ................. C30B 1/04 117/8 |
| 2011/0308447 A1 | 12/2011 | Imai et al. |
| 2013/0248902 A1 | 9/2013 | Ichinose et al. |
| 2014/0306237 A1 | 10/2014 | Ichinose et al. |

FOREIGN PATENT DOCUMENTS

| | | |
|---|---|---|
| EP | 2851458 A1 | 3/2015 |
| JP | 53-100177 A | 9/1978 |
| JP | 2001-181091 A | 7/2001 |
| JP | 2004-056098 A | 2/2004 |
| JP | 2004-262684 A | 9/2004 |
| JP | 2006-312571 A | 11/2006 |
| JP | 2012-020923 A | 2/2012 |
| WO | WO 2013/172227 A1 | 11/2013 |

OTHER PUBLICATIONS

K. Shimamura et al., "Transparent Conductive β-$Ga_2O_3$ Single Crystal as Substrates for White LEDs," Ceramics Japan, vol. 47, No. 3, 2012, pp. 156-160.

H. Aida et al., "Growth of β-$Ga_2O_3$ Single Crystals by the Edge-Defined, Film Fed Growth Method," Japanese Journal of Applied Physics, No. 47, No. 11, 2008, pp. 8506-8509.

Extended European Search Report dated Jun. 22, 2016.

Kiyoshi Shimamura, et al., Ceramics Japan, "Transparent Conductive β-$Ga_2O_3$, Single Crystals as Substrates for White LEDs", vol. 47, No. 3, 2012, pp. 156-160 (with partial English translation).

English Translation of the International Preliminary Report on Patentability in PCT Application No. PCT/JP2013/077489 dated May 21, 2015.

United States Office Action dated Aug. 25, 2016 in co-pending U.S. Appl. No. 14/358,011.

Chinese Office Action dated Nov. 28, 2016 and English Translation thereof.

United States Office Action dated Dec. 23, 2016 in U.S. Appl. No. 14/358,011.

Villora, et. al., "Large-size b-$Ga_2O_3$ single crystals and wafers", Journal of Crystal Growth 270 (2004) 420-426.

United States Office Action dated Jul. 27, 2017, in U.S. Appl. No. 14/358,011.

U.S. Office Action dated Feb. 7, 2018 in U.S. Appl. No. 14/358,011.

* cited by examiner

METHOD FOR GROWING B-GA2O3-BASED SINGLE CRYSTAL

TECHNICAL FIELD

The invention relates to a method for growing a β-Ga$_2$O$_3$-based single crystal.

BACKGROUND ART

A method for growing a Ga$_2$O$_3$ single crystal by EFG method is known (see, e.g., PTL 1). According to a method disclosed by PTL 1, wherein the method features growing a Ga$_2$O$_3$ single crystal while gradually expanding a width thereof downward from a contact portion with a seed crystal, namely while expanding a shoulder thereof, a plate-shaped crystal having a width larger than the seed crystal can be obtained.

CITATION LIST

Patent Literature

[PTL 1]
JP-A-2006-312571

SUMMARY OF INVENTION

Technical Problem

In the method disclosed by PTL 1, however, a problem may occur that in the process of expanding the shoulder, the Ga$_2$O$_3$ single crystal is likely to be twinned. In addition, if a plate-shaped seed crystal having a wide width is used so as to omit the expanding process of the shoulder, a problem is more likely to occur that the Ga$_2$O$_3$ crystal grown is subject to a partial polycrystallization or deterioration in the crystal quality.

It is an object of the invention to provide a method for growing a β-Ga$_2$O$_3$-based single crystal that can provide a plate-shaped β-Ga$_2$O$_3$-based single crystal having a high crystal quality.

Solution to Problem

According to one embodiment of the invention, a method for growing a β-Ga$_2$O$_3$-based single crystal set forth in [1] to [4] below is provided.

[1] A method for growing a β-Ga$_2$O$_3$-based single crystal employing an EFG method comprises:
 a step of bringing a plate-shaped seed crystal into contact with a Ga$_2$O$_3$-based melt, the plate-shaped seed crystal comprising a β-Ga$_2$O$_3$-based single crystal having a defect density of not more than 5×10$^5$/cm$^2$ in a whole region thereof; and
 a step of pulling up the seed crystal to grow the β-Ga$_2$O$_3$-based single crystal.
[2] The method for growing a β-Ga$_2$O$_3$-based single crystal according to [1], wherein the seed crystal is pulled up in a b axis direction thereof without carrying out a shoulder expansion in a width direction thereof to grow the β-Ga$_2$O$_3$-based single crystal.
[3] The method for growing a β-Ga$_2$O$_3$-based single crystal according to [1] or [2], wherein the β-Ga$_2$O$_3$-based single crystal comprises a plate-shaped single crystal having a (101) plane or a (−201) plane as a principal surface.
[4] The method for growing a β-Ga$_2$O$_3$-based single crystal according to [1] or [2], wherein the seed crystal has a width more than a width in a longitudinal direction of an opening part of a slit of a die configured to raise the Ga$_2$O$_3$-based melt in a crucible up to a position wherein the Ga$_2$O$_3$-based melt is brought into contact with the seed crystal.

Advantageous Effects of Invention

According to the invention, a method for growing a β-Ga$_2$O$_3$-based single crystal can be provided that can provide a plate-shaped β-Ga$_2$O$_3$-based single crystal having a high crystal quality.

DESCRIPTION OF EMBODIMENTS

Figure 1:
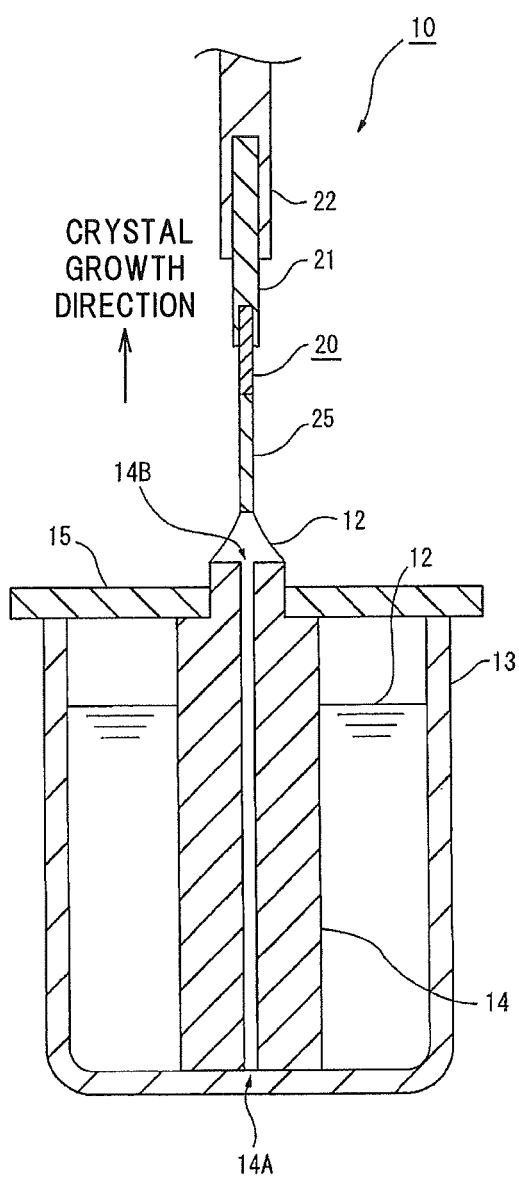
FIG. 1 is a vertical cross sectional view showing a part of an EFG crystal manufacturing device according to an embodiment.

[Embodiment]
FIG. 1 is a vertical cross sectional view showing a part of an EFG crystal manufacturing device according to the embodiment. The EFG crystal manufacturing device 10 includes a crucible 13 configured to receive a Ga$_2$O$_3$-based melt 12, a die 14 disposed in the crucible 13, the die having a slit 14A, a lid 15 configured to close the upper surface of the crucible 13 except for an opening part 14B of the slit 14A, a seed crystal holding tool 21 configured to hold a β-Ga$_2$O$_3$-based seed crystal (hereinafter, referred to as "seed crystal") 20, and a shaft 22 configured to liftably support the seed crystal holding tool 21.

The crucible 13 is configured to accommodate the Ga$_2$O$_3$-based melt 12 obtained by melting β-GaO$_3$-based powder. The crucible 13 is comprised of a metal material such as iridium that has heat resistance so as to be able to accommodate the Ga$_2$O$_3$-based melt 12.

The die 14 has the slit 14A configured to raise the Ga$_2$O$_3$-based melt 12 by capillarity phenomenon.

The lid 15 is configured to prevent the Ga$_2$O$_3$-based melt 12 having a high temperature from evaporating from the crucible 13, in addition, to prevent the vapor of the Ga$_2$O$_3$-based melt 12 from adhering to parts except for the upper surface of the slit 14A.

By lowering the seed crystal 20 so as to be brought into contact with the Ga$_2$O$_3$-based melt 12 that ascends through the slit 14A of the die 14 to the opening part 14B by capillarity phenomenon, and pulling up the seed crystal 20 brought into contact with the Ga$_2$O$_3$-based melt 12, a plate-shaped β-Ga$_2$O$_3$-based single crystal 25 is grown. The crystal orientation of the β-Ga$_2$O$_3$-based single crystal 25 is equal to the crystal orientation of the seed crystal 20, in order to control the crystal orientation of the β-Ga$_2$O$_3$-based single crystal 25, for example, the plane orientation of the bottom surface of the seed crystal 20 and the angle thereof in the horizontal plane are adjusted.

Figure 2:
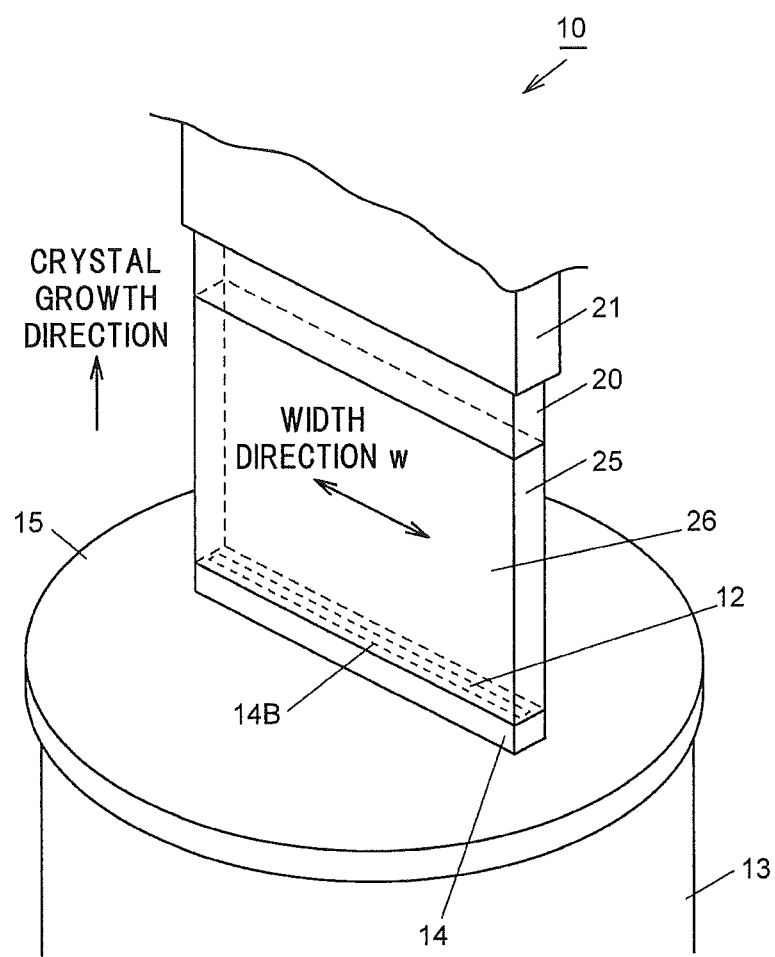
FIG. 2 is a perspective view showing a state of the β-Ga$_2$O$_3$-based single crystal during growth.

FIG. 2 is a perspective view showing a state of the β-Ga$_2$O$_3$-based single crystal during growth. A surface 26 in FIG. 2 is a principal surface of the β-Ga$_2$O$_3$-based single crystal 25 parallel to the slit direction of the slit 14A. In case of forming β-Ga$_2$O$_3$-based substrate by cutting out the β-Ga$_2$O$_3$-based single crystal 25 grown, the plane orientation of the surface 26 of the β-Ga$_2$O$_3$-based single crystal 25 is made coincident with the plane orientation of desired principal surface of the β-Ga$_2$O$_3$-based substrate. For example, in case of forming a β-Ga$_2$O$_3$-based substrate having a (101) plane as a principal surface, the plane orientation of the surface 26 is configured to be (101).

The β-Ga$_2$O$_3$-based single crystal 25 and the seed crystal 20 are formed of a β-Ga$_2$O$_3$ single crystal or a β-Ga$_2$O$_3$ single crystal with an element such as Cu, Ag, Zn, Cd, Al, In, Si, Ge and Sn added thereto. The β-Ga$_2$O$_3$ crystal has a β-gallia structure that belongs to monoclinic system, the lattice constant is typically $a_0$=12.23 angstroms, $b_0$=3.04 angstroms, $c_0$=5.80 angstroms, α=γ=90 degrees, β=103.8 degrees.

The defect density in the whole region of the β-Ga$_2$O$_3$-based single crystal constituting the seed crystal 20 is not more than $5\times10^5$/cm$^2$. By satisfying this condition, even if the seed crystal 20 is a plate shaped crystal having a wide width, partial polycrystallization and deterioration in crystal quality of the Ga$_2$O$_3$ crystal to be grown can be prevented.

The seed crystal 20 is obtained, for example, by carrying out an evaluation of the defect density for a plurality of the β-Ga$_2$O$_3$-based single crystals grown so as to select single crystals in which the defect density in the whole region is not more than $5\times10^5$/cm$^2$. One example of a method for evaluating the defect density is shown below.

First, a part of the β-Ga$_2$O$_3$-based single crystal is cut perpendicularly to the growing direction so as to cut out thin plate-shaped single crystals. Next, a surface of the thin plate-shaped single crystal perpendicular to the growing direction is mirror-polished so as to be subjected to a chemical etching with hot phosphoric acid or the like. At this time, since the etching rate is increased in the defect parts, depressions (etch pits) are generated. By counting the number per unit area of the etch pit, the defect density is examined Further, the defects propagate in the growing direction of the β-Ga$_2$O$_3$-based single crystal, thus by examining the defect density of one thin plate-shaped single crystal, the defect density of the whole of the β-Ga$_2$O$_3$-based single crystal can be examined.

In addition, by using the plate-shaped seed crystal 20 having a wide width, as shown in FIG. 2, the plate-shaped β-Ga$_2$O$_3$-based single crystal 25 having a wide width can be obtained without carrying out shoulder expansion. Consequently, a problem associated with the shoulder expansion of single crystals, e.g. twin crystal or twinning at the time of the shoulder expansion in the width direction w can be avoided.

Specifically, in case of growing the plate-shaped β-Ga$_2$O$_3$-based single crystal 25 by pulling up it in the b axis direction, due to carrying out the shoulder expansion in the width direction w, there is a risk that the β-Ga$_2$O$_3$-based single crystal 25 causes the twin crystal or twinning. According to the embodiment, for example, the plate-shaped β-Ga$_2$O$_3$-based single crystal 25 having a (101) plane or a (−201) plane as a principal surface can be grown by pulling up it in the b axis direction without carrying out the shoulder expansion in the width direction w, and without causing the twin crystal or twinning In addition, for the purpose of growing the plate-shaped β-Ga$_2$O$_3$-based single crystal 25 having a wide width without carrying out the shoulder expansion, it is preferable that the seed crystal 20 has a width larger than a width in the longitudinal direction of the opening part 14B of the slit 14A of the die 14.

Figure 3:
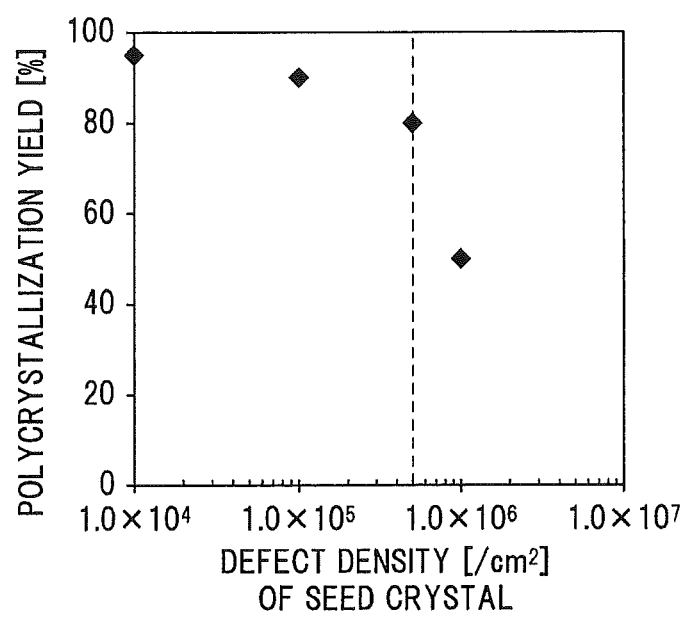
FIG. 3 is a graph showing the relationship between the defect density of a seed crystal and the polycrystallization yield of a β-Ga$_2$O$_3$-based single crystal.

FIG. 3 is a graph showing a relationship between the defect density of the seed crystal and the polycrystallization yield of the β-Ga$_2$O$_3$-based single crystal. The horizontal axis in FIG. 3 represents the maximum value of the defect density (/cm$^2$) (a value of the defect density (/cm$^2$) in the region having the largest number of the defect) of the seed crystal 20, and the vertical axis represents the polycrystallization yield (%) of the β-Ga$_2$O$_3$-based single crystal 25 grown by using the seed crystal 20. Here, the polycrystallization yield means a yield at the time of judging polycrystallized crystals as a defective product.

FIG. 3 shows that the polycrystallization yield becomes not less than 80% when the maximum value of the defect density of the seed crystal 20 is not more than $5.0\times10^5$/cm$^2$. Generally, 80% is often used as the basis of the yield of the oxide single crystal. Thus, in order to suppress the polycrystallization of the β-Ga$_2$O$_3$-based single crystal 25, it is preferable that the maximum value of the defect density of the seed crystal 20 is not more than $5.0\times10^5$/cm$^2$, namely the defect density in the whole region is not more than $5\times10^5$/cm$^2$.

Figure 4:
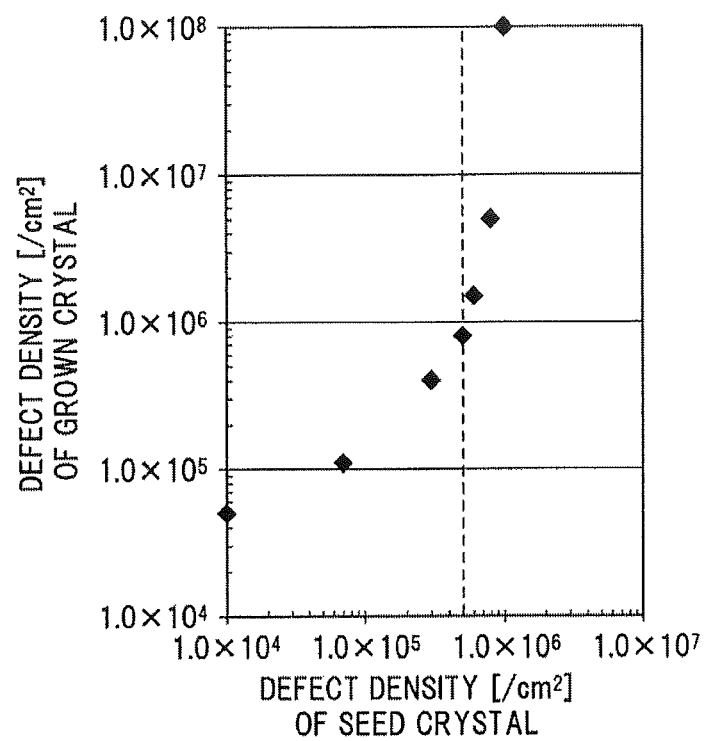
FIG. 4 is a graph showing the relationship between the defect density of a seed crystal and the defect density of a β-Ga$_2$O$_3$-based single crystal.

FIG. 4 is a graph showing a relationship between the defect density of the seed crystal and the defect density of the β-Ga$_2$O$_3$-based single crystal. The horizontal axis in FIG. 4 represents the maximum value of the defect density (/cm$^2$) of the seed crystal 20 and the vertical axis represents the maximum value of the defect density (/cm$^2$) of the β-Ga$_2$O$_3$-based single crystal 25 grown by using the seed crystal 20.

FIG. 4 shows that the more the maximum value of the defect density of the seed crystal 20 becomes large, the more the maximum value of the defect density of the β-Ga$_2$O$_3$-based single crystal 25 becomes large, in particular, when the maximum value of the defect density of the seed crystal 20 is not less than $3.0\times10^5$/cm$^2$, the more the maximum value of the defect density of the seed crystal 20 becomes large, the more the difference between the maximum value of the defect density of the seed crystal 20 and the maximum value of the defect density of the β-Ga$_2$O$_3$-based single crystal 25 becomes large. According to FIG. 4, when the maximum value of the defect density of the seed crystal 20 is not more than $5.0\times10^5$/cm$^2$, the maximum value of the defect density of the β-Ga$_2$O$_3$-based single crystal 25 becomes not more than $1.0\times10^6$/cm$^2$.

Generally, in case of using the β-Ga$_2$O$_3$-based single crystal as an LED substrate, the defect density of not more than $1.0\times10^6$/cm$^2$ is often utilized as an index of crystal quality. Thus, in order to grow the β-Ga$_2$O$_3$-based single crystal 25 having high quality for the LED, it is preferable that the maximum value of the defect density of the seed crystal 20 is not more than $5.0\times10^5$/cm$^2$, namely the defect density in the whole region is not more than $5\times10^5$/cm$^2$.

Further, the seed crystal 20 and the β-Ga$_2$O$_3$-based single crystal 25 according to FIGS. 3, 4 are a plate-shaped β-Ga$_2$O$_3$ single crystal having a (101) plane or a (−201) plane as a principal surface, and the β-Ga$_2$O$_3$-based single crystal 25 is a crystal grown in the b axis direction by pulling up the seed crystal 20 in the b axis direction. However, if the β-Ga$_2$O$_3$-based single crystal 25 is grown in the b axis direction by pulling up the seed crystal 20 in the b axis direction, the plane orientation of the principal surface of the seed crystal 20 and the β-Ga$_2$O$_3$-based single crystal 25 is not limited, but a crystal of which plane orientation is any one without limitation has also the same characteristics as the crystal of which plane orientation is a (101) plane or a (−201) plane.

Hereinafter, one example of the growth condition of the β-Ga₂O₃-based single crystal 25 will be explained.

For example, the growth of the βGa₂O₃-based single crystal 25 is carried out under a nitrogen atmosphere or under a mixed atmosphere of nitrogen and oxygen.

As shown in FIG. 2, in case of using the plate-shaped seed crystal 20 having a wide width, the seed 20 is larger than a seed crystal used for the usual crystal growth, thus it is susceptible to thermal impact. Consequently, it is preferable that the lowering speed of the seed crystal 20 before being brought into contact with the Ga₂O₃-based melt 12 is low to some extent, for example, not less than 5 mm/min is preferable.

It is preferable that the waiting time until the seed crystal 20 is pulled up after being brought into contact with the Ga₂O₃-based melt 12 is long to some extent so as to prevent thermal impact by further stabilizing the temperature, for example, not less than 1 min is preferable.

It is preferable that the temperature ascending speed when raw materials in the crucible 13 are melted is low to some extent so as to prevent that the temperature around the crucible 13 rapidly ascends so that thermal impact is applied to the seed crystal 20, for example, it is preferable that the raw materials are melted while taking a time of not less than 5 hours (Effects of the Embodiment)

According to the embodiment, by using the plate-shaped seed crystal 20 in which the defect density in the whole region is not more than 5×10⁵/cm², the plate-shaped β-Ga₂O₃-based single crystal 25 that suppresses polycrystallization and has high crystal quality can be grown.

In addition, even if the seed crystal 20 is a plate-shaped crystal having a wide width, the β-Ga₂O₃-based single crystal 25 that suppresses polycrystallization and has high crystal quality can be also grown. Thus, the plate-shaped β-Ga₂O₃-based single crystal 25 having a wide width can be grown without carrying out the shoulder expansion so that a problem associated with the shoulder expansion, e.g. twin crystal or twinning of the β-Ga₂O₃-based single crystal 25 can be avoided.

Although the embodiment of the invention has been described above, the invention according to claims is not to be limited to the above-mentioned embodiment. Further, it should be noted that all combinations of the features described in the embodiment are not necessary to solve the problem of the invention.

INDUSTRIAL APPLICABILITY

A method for growing a β-Ga₂O₃-based single crystal is provided which can provide a plate-shaped β-Ga₂O₃-based single crystal having a high crystal quality.

REFERENCE SIGNS LIST

10 EFG crystal manufacturing device
20 seed crystal
25 β-Ga₂O₃-based single crystal

The invention claimed is:

1. A method for growing a β-Ga₂O₃-based single crystal employing an edge-defined film-fed growth (EFG) method, the method comprising:
   bringing a plate-shaped seed crystal into contact with a Ga₂O₃-based melt, the plate-shaped seed crystal being of β-Ga₂O₃-based single crystal having a defect density of not more than 5×10⁵/cm² in a whole region of the plate-shaped seed crystal; and
   pulling up the seed crystal to grow theβ-Ga₂O₃-based single crystal, the β-Ga₂O₃-based single crystal being grown to be plate-shaped without carrying out a shoulder expansion to avoid twin crystal or twinning, the β-Ga₂O₃-based single crystal being equal in width to the plate-shaped seed crystal,
   wherein the β-Ga₂O₃-based single crystal is grown to have the defect density of not more than 1.0×10⁶cm².

2. The method for growing a β-Ga₂O₃-based single crystal according to claim 1, wherein the seed crystal is pulled up in a b axis direction thereof.

3. The method for growing a βGa₂O₃-based single crystal according to claim 1, wherein the 3-Ga₂O₃-based single crystal comprises a single crystal including a (101) plane or a (−201) plane as a principal surface.

4. The method for growing a β-Ga₂O₃-based single crystal according to claim 1, wherein the seed crystal has a width more than a width in a longitudinal direction of an opening part of a slit of a die configured to raise the Ga₂O₃-based melt in a crucible up to a position wherein the Ga₂O₃-based melt is brought into contact with the seed crystal.

5. The method for growing a β-Ga₂O₃-based single crystal according to claim 1, wherein the β-Ga₂O₃-based single crystal comprises a single crystal including a (−201) plane as a principal surface.

6. The method for growing a β-Ga₂O₃-based single crystal according to claim 1, wherein said bringing the plate-shaped seed crystal into contact with the Ga₂O₃-based melt includes raising the Ga₂O₃-based melt by a capillarity phenomenon.

7. The method for growing a β-Ga₂O₃-based single crystal according to claim 1, wherein a crystal orientation of the β-Ga₂O₃-based single crystal is equal to a crystal orientation of the seed crystal.

8. The method for growing a β-Ga₂O₃-based single crystal according to claim 1, wherein the β-Ga₂O₃-based single crystal and the seed crystal include a β-Ga₂O₃single crystal.

9. The method for growing a β-Ga₂O₃-based single crystal according to claim 1, wherein the β-Ga₂O₃-based single crystal is plate-shaped without carrying out the shoulder expansion in a width direction that is perpendicular to a growth direction of the β-Ga₂O₃-based single crystal.

* * * * *